US 6,727,562 B2

(12) United States Patent
Han et al.

(10) Patent No.: US 6,727,562 B2
(45) Date of Patent: Apr. 27, 2004

(54) BASIC COMMON OPTICAL CELL CONFIGURATION OF DUAL CAVITIES FOR OPTICAL TUNABLE DEVICES

(75) Inventors: Naiqian Han, Sunnyvale, CA (US); Jidong Hou, Cupertino, CA (US); Xiaoping Zhang, Cupertino, CA (US); Liji Huang, San Jose, CA (US); Gaofeng Wang, Sunnyvale, CA (US)

(73) Assignee: Intpax, Inc., Cupertino, CA (US)

( * ) Notice: Subject to any disclaimer, the term of this patent is extended or adjusted under 35 U.S.C. 154(b) by 0 days.

(21) Appl. No.: 10/165,490

(22) Filed: Jun. 7, 2002

(65) Prior Publication Data

US 2003/0137020 A1 Jul. 24, 2003

Related U.S. Application Data

(60) Provisional application No. 60/351,689, filed on Jan. 22, 2002.

(51) Int. Cl.⁷ .............................................. H01L 29/82
(52) U.S. Cl. ...................... 257/415; 359/290; 359/291; 359/295; 359/298; 372/50
(58) Field of Search ................................ 359/298, 290, 359/291, 295; 372/50

(56) References Cited

U.S. PATENT DOCUMENTS 6,556,338 B2 * 4/2003 Han et al. .................. 359/298
6,567,448 B1 * 5/2003 Sun et al.

* cited by examiner

Primary Examiner—David Nelms
Assistant Examiner—Mai-Huong Tran
(74) Attorney, Agent, or Firm—Bo-In Lin

(57) ABSTRACT

The present invention discloses a tunable optical device. The tunable optical device includes a tuning cavity having a tuning means provided for alternately bonding to at least two different tunable optical cells each comprising a tuning membrane wherein the tuning cavity disposed near the tuning membrane for moving the tuning membrane for tuning one of the at least two tunable optical cells bonded thereon. In a preferred embodiment, the tuning cavity further includes a first electrode disposed on the tuning membrane and a second electrode disposed on a substrate supporting the tuning cavity for applying a voltage to move the tuning membrane. In a preferred embodiment, the optical device further includes an optical device control circuit connected to the tuning means for controlling and moving the tuning membrane. In a preferred embodiment, the tuning cavity further includes through hole along an optical path for an optical transmission passing through the tunable membrane for providing an interface-free and ripple-free optical path for the optical transmission. In a preferred embodiment, the tunable optical cells constitute an optical filter for bonding to the tuning cavity and tunable by moving the tunable membrane. In a preferred embodiment, the tunable optical cells constitute an optical attenuator for bonding to the tuning cavity and tunable by moving the tunable membrane. In a preferred embodiment, the tunable optical cells constitute an optical switch for bonding to the tuning cavity and tunable by moving the tunable membrane. In a preferred embodiment, the tunable optical cells constitute an optical dispersion compensator for bonding to the tuning cavity and tunable by moving the tunable membrane. In a preferred embodiment, the optical device constitutes a micro-electro-mechanical system (MEMS) optical device manufactured by applying a micro-electro-mechanical system (MEMS) technology.

33 Claims, 8 Drawing Sheets

BASIC COMMON OPTICAL CELL CONFIGURATION OF DUAL CAVITIES FOR OPTICAL TUNABLE DEVICES

This Application claims a priority date of Jan. 22, 2002 benefited from a previously filed Provisional Patent Application No. 60/351,689 filed on Jan. 22, 2002, now abandoned by the Applicants of this Formal Patent Application.

BACKGROUND OF THE INVENTION

1. Field of the Invention

This invention relates generally to apparatus and methods for designing micro-electromechanical system (MEMS) based optical and photonic devices for fiber optical transmission systems. More particularly, this invention is related to the optimization of the configuration of optical and photonic tunable devices based on Fabry-Perot theory such as variable optical attenuator (VOA), tunable filter, optical switch, dynamic dispersion compensator, etc., for use in optical communication sub-system or system.

2. Description of the Related Art

Even with recent advancements made in the MEMS technologies to produce optical devices with low power consumption, small size, high speed and reliability, the designs, manufacture and package of the tunable MEMS devices based on Fabry-Perot principle are still faced with a very demanding technical challenge. Specifically, since the performances of a Fabry-Perot based tunable optical device is determined by the structure of the membranes and the gap between the membranes, different tunable optical devices generally use different membranes and different control circuits for controlling and tuning the gaps between the membranes of these optical devices. Accordingly, different MEMS optical devices are made with different size and structural features each controlled by different control circuits having different packages. There is a lack of standard basic device structure and control methodology for the Fabry-Perot based tunable MEMS devices. The production costs, product reliability and device performance are adversely affected due to the lack of standard structural and device tuning configurations.

Based on the well known Fabry-Perot interferometer constructed by Charles Fabry and Alfred Perot, Goossen discloses in U.S. Pat. Nos. 5,943,155 and 5,949,571, entitled "MARS Optical Modulator" a resonator formed with membrane supported on a silicon substrate. The device is made with surface micro-electro-machining process. The membrane of the resonator is tuned electronically to provide an electrically tunable modulator. Goosen's modulator as disclosed has several technical limitations. One co-pending patent application filed by some of the co-inventors of this Application, MEMS based variable optical attenuator, and a to-be filed patent, MEMS based tunable optical filter, disclose further improvement for manufacturing variable optical attenuators (VOA) and tunable optical filter to overcome Goossn'e limitations. The co-pending Patent Application are hereby incorporated by reference in this Application. The co-pending Applications provide mass producible tunable MEMS device with improved performance. However, there is still a demand for standard MEMS device structure assembled with simplified configuration while tunable with a single control circuit for a standard tuning cavity such that the manufacturing processes and configuration can be conveniently employed for producing different kinds of optical devices.

A need still exists in the art in the field of the optical signal transmission systems to provide an optimized design and configuration to manufacture an universal basic tunable device structure controllable by a single standard control configuration in order to overcome the difficulties and limitations now encountered in the prior art. It is further desirable that different devices are designed to be controllable by a single smart control circuit. One smart control circuit is able to compensate different environmental factors such as temperature variations for different types of optical devices so that a selected wavelength, attenuation or dispersion value, according to device designs can be fixed without substantial impact due to variations of environmental conditions.

SUMMARY OF THE PRESENT INVENTION

It is the object of the present invention to provide a new design and manufacture method for producing tunable optical devices with novel tuning configuration implemented with a separate and universal tuning cavity. This separate universal tuning cavity can be implemented in different kinds of tunable optical devices with standard control circuit. Therefore, this invention discloses a standard configuration for MEMS based tunable optical devices to overcome the limitations and difficulties as discussed above for the prior art techniques.

Specifically, it is an object to the present invention to provide a new design and manufacture method for producing tunable optical devices with a standard dual cavity configuration includes a performance cavity based on device design specifications and a tuning cavity for tuning the optical device embodied in the performance cavity. The tuning cavity is designed to have tuning ranges suitable for different kinds of optical devices to be embodied in the performance cavity. Therefore, the tuning cavity can be universally implemented to a wide varieties of tunable MEMS based optical devices with a single standardized control circuit for tuning and controlling different types of tunable optical devices with reduced production costs and higher performance and improved device reliability.

Another object of the invention is to present a new design and manufacture method for producing tunable optical devices with a standard dual cavity configuration includes a performance cavity and a tuning cavity. The performance cavity includes two membranes wherein the shape, size and gap between the membranes are based on device design specifications and these two membranes may be simultaneously produced by identical set of silicon-based MEMS manufacturing processes such that the optical loss of the performance can be optimally reduced for particular optical devices while for other devices, such as dispersion compensation device, two different membranes are provided.

Another object of the invention is to present a new design and manufacture method for producing tunable optical devices with a standard dual cavity configuration includes a performance cavity and a tuning cavity. The performance cavity includes two membranes wherein the membranes are formed with multiple layers to increase the refraction rates and the membranes further include non-conductive areas to reduce optical loss and achieve higher resonating performance.

Another object of the invention is to present a new design and manufacture method for producing tunable optical devices with a standard dual cavity configuration includes a performance cavity and a tuning cavity. The performance of the optical device is further improved by using a 100% reflection mirror to re-direct the light beam and by causing the light passing twice through the performance cavity functioning as a resonator. The residual basic mode of MEMS resonator is designed to match the input light mode. In one preferred embodiment performance cavity is formed with parallel structure to achieve very low insertion loss without the match of the basic resonator residual mode and a specified incident beam mode.

Another object of the invention is to present a new design and manufacture method for producing tunable optical devices with a standard dual cavity configuration includes a performance cavity and a tuning cavity. In the tuning cavity, the electrodes for tuning are formed as face-to-face conductive layers with no dielectric between the conductive layer, so that no material traps the charges between the positive and negative electrodes. An electronic control circuit with temperature and wavelength compensation functionality makes the tunable MEMS device to function with stability at the tuned wavelength without variation when the temperature changes.

Specifically, this invention discloses a tunable optical device is disclosed. The tunable optical device includes a tuning cavity having a tuning means provided for alternately bonding to at least two different tunable optical cells each comprising a tuning membrane wherein the tuning cavity disposed near the tuning membrane for moving the tuning membrane for tuning one of the at least two tunable optical cells bonded thereon. In a preferred embodiment, the tuning cavity further includes a first electrode disposed on the tuning membrane and a second electrode disposed on a substrate supporting the tuning cavity for applying a voltage to move the tuning membrane. In a preferred embodiment, the optical device further includes an optical device control circuit connected to the tuning means for controlling and moving the tuning membrane. In a preferred embodiment, the tuning cavity further includes through hole along an optical path for an optical transmission passing through the tunable membrane for providing an interface-free and ripple-free optical path for the optical transmission. In a preferred embodiment, the tunable optical cells constitute an optical filter for bonding to the tuning cavity and tunable by moving the tunable membrane. In a preferred embodiment, the tunable optical cells constitute an optical attenuator for bonding to the tuning cavity and tunable by moving the tunable membrane. In a preferred embodiment, the tunable optical cells constitute an optical switch for bonding to the tuning cavity and tunable by moving the tunable membrane. In a preferred embodiment, the tunable optical cells constitute an optical dispersion compensator for bonding to the tuning cavity and tunable by moving the tunable membrane. In a preferred embodiment, the optical device constitutes a micro-electro-mechanical system (MEMS) optical device manufactured by applying a micro-electro-mechanical system (MEMS) technology.

Briefly, this invention discloses a method for configuring a tunable optical device. The method includes a step of forming a tuning cavity by providing a tuning means for alternately bonding one of at least two different tunable optical cells each comprising a tuning membrane and disposing the tuning cavity near the tuning membrane for moving the tuning membrane for tuning one of the at least two tunable optical cells bonded thereon. In a preferred embodiment, the step of forming the tuning cavity further includes a step of disposing a first electrode on the tuning membrane and disposing a second electrode on a substrate supporting the tuning cavity for applying a voltage to move the tuning membrane. In a preferred embodiment, the method further includes a step of connecting an optical device control circuit to the tuning means for controlling and moving the tuning membrane. In a preferred embodiment, the step of forming the tuning cavity further includes a step of opening a through hole in the tuning cavity along an optical path for an optical transmission passing through the tunable membrane for providing an interface-free and ripple-free optical path for the optical transmission. In a preferred embodiment, the step of alternately bonding the one of at least two different types of tunable optical cells further comprise a step of bonding an optical filter to the tuning cavity. In a preferred embodiment, the step of alternately bonding the one of at least two different types of tunable optical cells further comprise a step of bonding an optical attenuator to the tuning cavity. In a preferred embodiment, the step of alternately bonding the one of at least two different types of tunable optical cells further comprise a step of bonding an optical switch to the tuning cavity. In a preferred embodiment, the step of alternately bonding the one of at least two different types of tunable optical cells further comprise a step of bonding an optical dispersion compensator to the tuning cavity. In a preferred embodiment, the step of alternately bonding the one of at least two different types of tunable optical cells to the tunable cavity further comprising a step of applying a micro-electro-mechanical system (MEMS) technology for manufacturing and bonding the one of at least two different types of tunable optical cells to the tunable cavity.

These new configurations produce an optical tunable device with low insertion loss, low polarization dependent loss, low temperature-dependent loss (TDL), high performance ripple free, larger fineness or larger tuning attenuation range. The present invention also provides a device configuration with relatively large tolerances of manufacturing process-deviations hence significantly reduces the production cost.

BRIEF DESCRIPTION OF THE REFERENCE AND DRAWINGS

DETAILED DESCRIPTION OF THE PREFERRED EMBODIMENT

Figure 1:
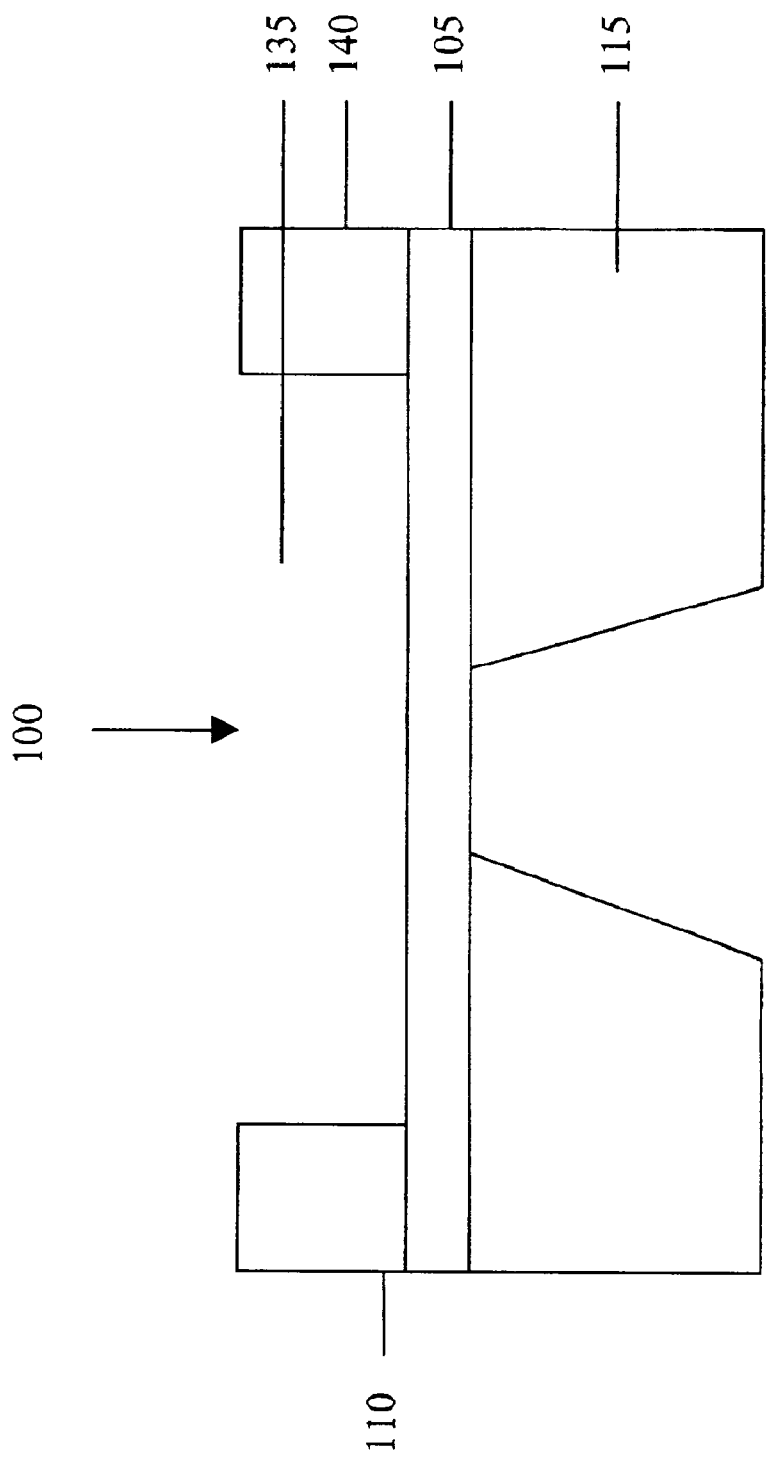
FIG. 1 is a cross sectional view of a single or multi-layered membrane formed on a substrate by applying a bulk MEMS process with spacer stands on top of the membrane.

Referring to FIG. 1 for the cross sectional view of a basic MEMS cell for the purpose of forming a performance cavity. An optical cell 100 is formed with stationary membrane 105 that will not move as will be further described below. A light transmission chamber 135 is surrounded by chamber wall 140. The membrane 105 and the chamber wall are supported on a substrate 115. The membrane is formed as a single layer membrane or a membrane comprises multiple layers as that shown in FIGS. 2A and 2B. The chamber wall 140 is formed as a spacer that can be zero or one certain number according to device and the MEMS manufacture processes and device structure requirements.

Figure 2B:
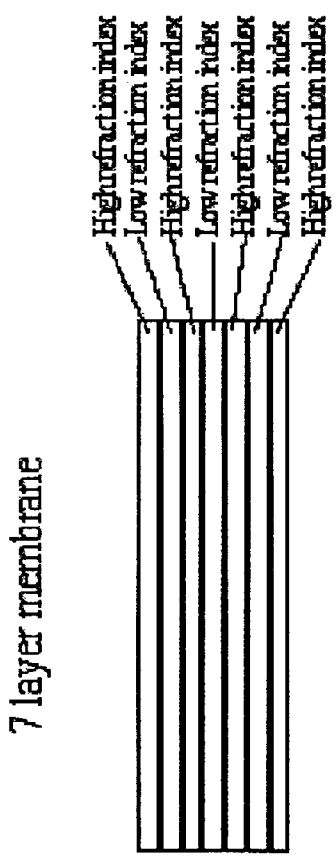
FIGS. 2A and 2B are a cross sectional view of odd number of layers to form a membrane. The examples show five and nine layers.
Figure 2A:
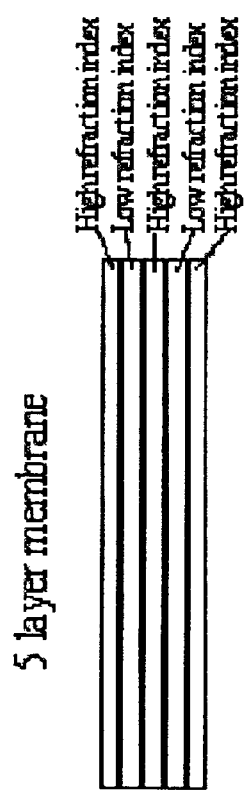

FIGS. 2A and 2B are cross sectional view of the membrane 105 for showing the layer structures of the membrane 105. The membrane is formed by odd number of layers, e.g., three, five, seven . . . N layers, where N represents an odd positive integer. The cascaded layers consisted of alternately one high refraction index, such as 3.5, layer against another layer of low refraction index, such as 2.2. The two outermost layers, e.g., the first and the Nth layers, are layers of high refraction indexes. This layer structure achieves high reflection rate and also improve the mechanical property of surface flatness among alternate layers of the membrane. In FIG. 2A, a five layer membrane provides a 95% reflection rate. In FIG. 2B, a seven layers are cascaded to form the membrane which provides a higher reflection rate or 98%.

Figure 3:
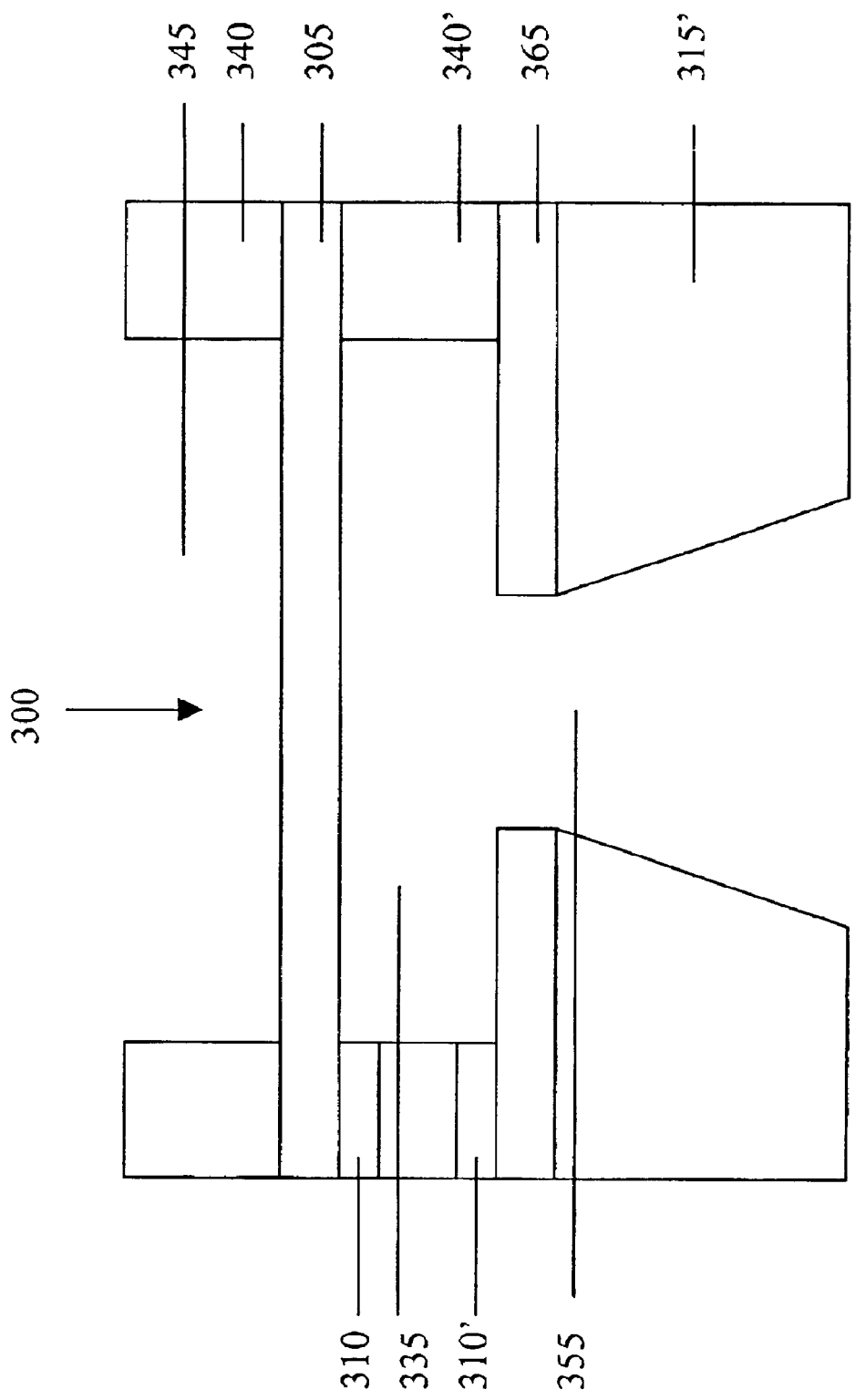
FIG. 3 is a cross sectional view of a tuning cavity with a membrane stands on a substrate with spacer and face-to-face electrodes disposed thereon wherein the spacer stand on top of the membrane.

FIG. 3 is a cross sectional view for showing the embodiment of the present invention of a tuning cavity 300 with the function of the tuning cavity to be further described in FIG. 4 below. A membrane 305 is extended between an upper spacer 340 and a lower spacer 340'. The upper and lower spacers 340 and 340' are supported on a substrate 315'. The details of the layer structure of the membrane 305 are shown in FIG. 2A or 2B. A conductive layer 365 is formed on the top surface of the substrate 315' and disposed below the lower spacer 340'. Two face-to-face electrodes, electrodes 310 and 310', are formed below the membrane 305 and above the conductive layer 365. Under the circumstances that the substrate 315' is composed of a conductive material, then the conductive layer 365 can be merged with the substrate 315' and the layer 365 becomes the top surface of the substrate 315'. A cavity 335 is defined by the membrane 305 and the substrate 315' with a through hole opened in the substrate 315' such that a light is transmitted passing the through hole without attenuations. With a configuration of electrodes 310 and 310' face-to-face, potential problems of charge retentions can be eliminated. By applying voltage unto the electrodes, the cavity 335 can be electrically tuned. A tuning circuit is determined based on the thickness of the spacer 340'. The thickness of the upper spacer 340 is determined based on the requirements of a performance cavity to be further discussed in FIG. 4 below. The thickness of the lower spacer 340' can be independent from the upper spacer 340.

Figure 4:
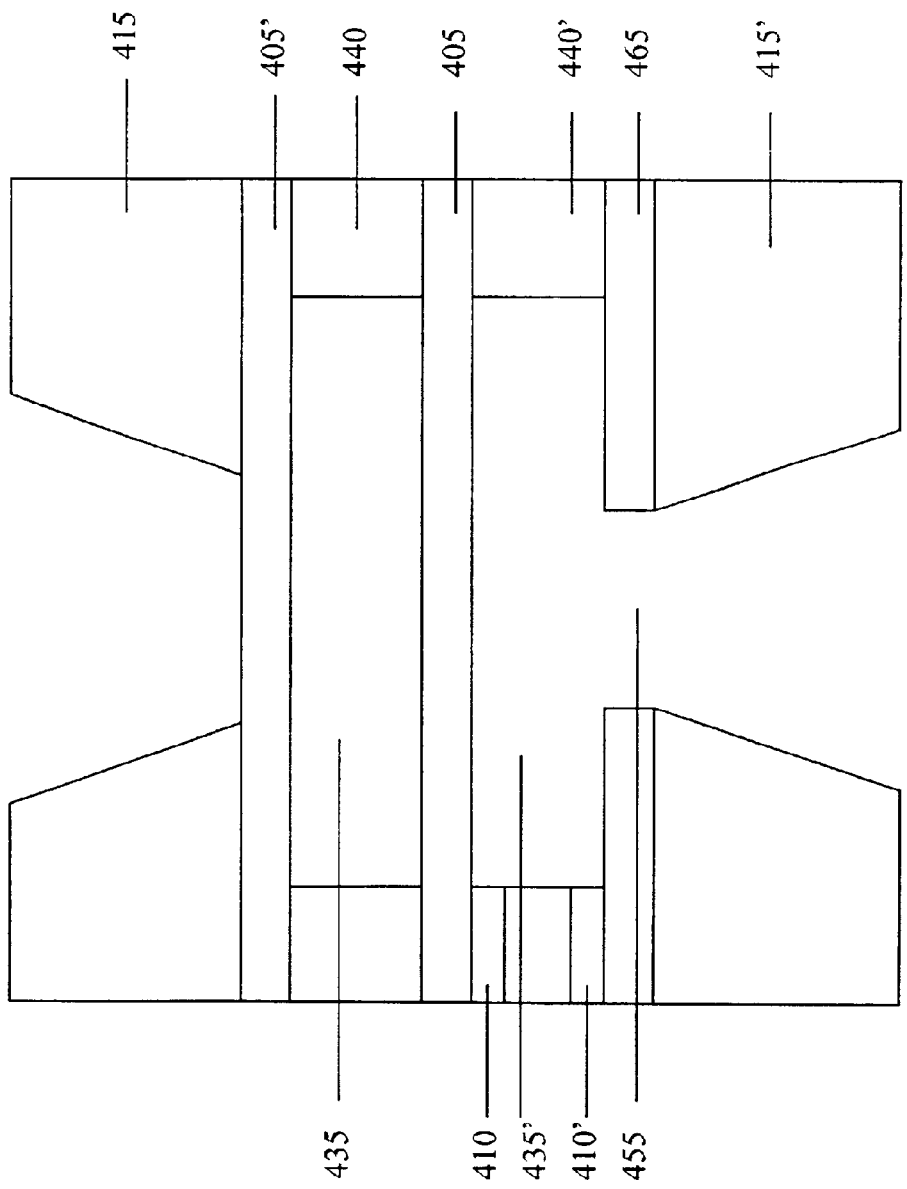
FIG. 4 is a cross sectional view of a combined structure boding the performance cavity and tuning cavity together.

Referring to FIG. 4 for an optical device 400 formed with universal basic structure disclosed in this invention by bonding the optical cell of FIG. 1 to the tuning cavity disclosed in FIG. 3 as discussed above. This universal basic device structure has two cavities. The upper cavity 435 is between membranes 405' and 405 surrounded by spacer 440, this cavity 435 is a performance cavity. The device operational performance is dictated by the functional characteristics of this performance cavity 435. The distance between the membranes 405 and 405' and the tuning ranges of the gap distance determine the functional characteristics of the optical device 400. The bottom cavity 435' disposed below the membrane 405 and above the substrate 415' is a tuning cavity. The function of the tuning cavity is implemented to apply voltage to the electrodes 410 and 410' to adjust the position and shape of the membrane 405 thus tuning the operational functional characteristics of the performance cavity 435. For the purpose of forming a high performance low loss optical device, it is preferable, even though not required in every device, that the operational characteristics of the pair of membranes 405 and 405' of the performance cavity 435 should be identical. In order to provide identical membranes, these two membranes 405 and 405' are manufactured simultaneously by a same set of manufacturing processes. The shape and size of the performance cavity 435 is designed and manufactured according to a set of device specifications based on the product requirements. The shape and size of two membranes can be the same or different from each other depending on the performance characteristics and requirements of the optical device.

As the performance cavity 435 is manufactured to have particular cavity and device configuration according to a set of product requirements, the tuning cavity 435' when implemented for tuning the device by applying voltage to activate a membrane movement of the membrane 405 is independent from the particular cavity configuration of 435. A range of electric voltages may be applied to electrodes 410 and 410' for adjusting the gap of the performance cavity 435 for a plurality of gap distances that may be useful for devices such as VOA, filters, switch, dispersion compensator, etc. One control circuit for controlling the tuning cavity 435' may be applied for different kinds of MEMS optical devices according to the design and configuration of the performance cavity 435. A same control board suitable for applying a range of voltages onto the electrodes 405 and 405' may be used for different types of tunable MEMS devices such as optical filters, switch, dispersion compensators, VOA, etc., and these optical devices can be realized by changing the designs and configurations of the performance cavity 435. Specifically, the gap and the membrane patterns of the tuning cavity 435' are chosen with suitable values to provide a sufficient tuning range before the membrane 405 is in a pull-in position. An un-doped center on the membrane 405 has an advantage to extend the pull-in position that provides enhanced control over the MEMS device. A large gap also reduces the air damping effect such that the response time of the optical device is reduced. It is preferable to control the membrane with a lower voltage, e.g., a voltage below twenty volts is preferred. Another advantage of the configuration with a separate performance and tuning cavities is the reduction of temperature dependent loss to about half when compared to a temperature dependent loss implemented with tuning optical device by moving two membranes. The temperature sensitivity of a MEMS device is proportionally increased with the number of membranes employed for tuning. Reduction of temperature sensitivity is achieved when there is only one membrane used for tuning the optical device.

Figure 5B:
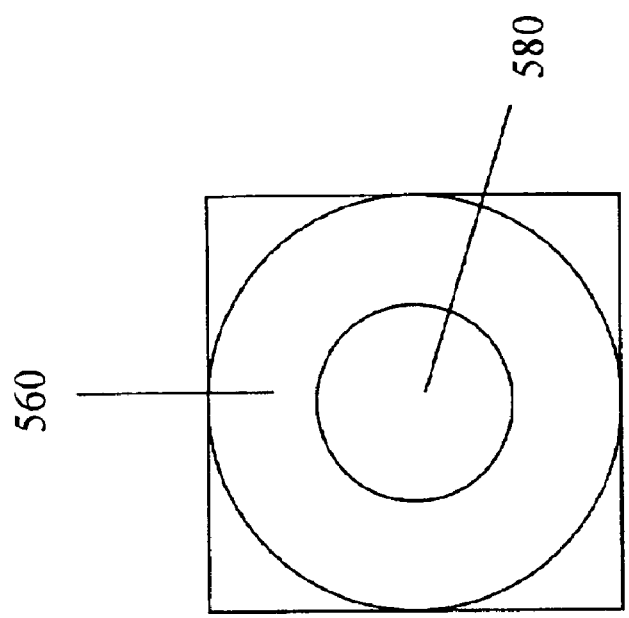
FIG. 5B is the membrane with un-conductive layer at the center of the membrane.
Figure 5A:
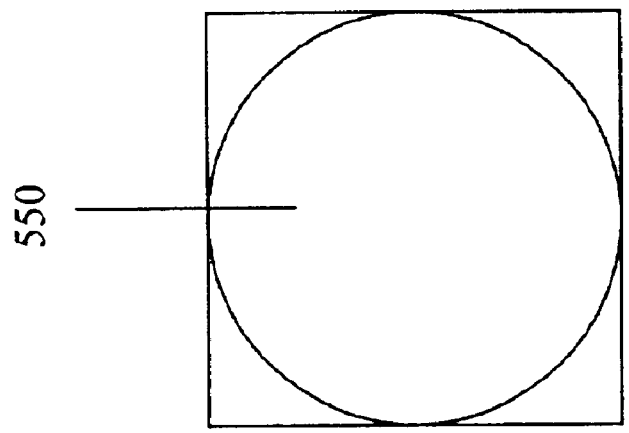
FIG. 5A is a top view of the membrane with non-conductive area at light path.

FIG. 5A shows the schematic structure of membrane 405 in the performance cavity. A conductive layer 550 covers the entire surface of the outmost layers of the membrane. The conductive layer coated over the membrane will cause optical transmission losses. Therefore, the electrode configuration as shown in FIG. 5A is implemented for optical device less sensitive to transmission losses. Alternate preferred embodiment as that shown in FIG. 5B is implemented for optical device that requires lower rate of optical transmission losses. In FIG. 5B, a ring-shaped conductive layer 560 is coated on the outermost surface of the membrane to reduce the optical transmission loss at center where the optical path is. The conductive layer to function as an electrode 560 is coated as a ring. A center area 580 is not coated with the conductive material thus forming an un-conductive area 580. Normally, transmission loss occurs when an optical signal passes through a conductive area coated or doped with a conductive material. The un-conductive area 580' is formed to function as a low loss but high reflection rate mirror. This structure has also thermal stable characteristic, which is disclosed in a co-pending patent Application filed by a common inventor of this Application.

Figure 6:
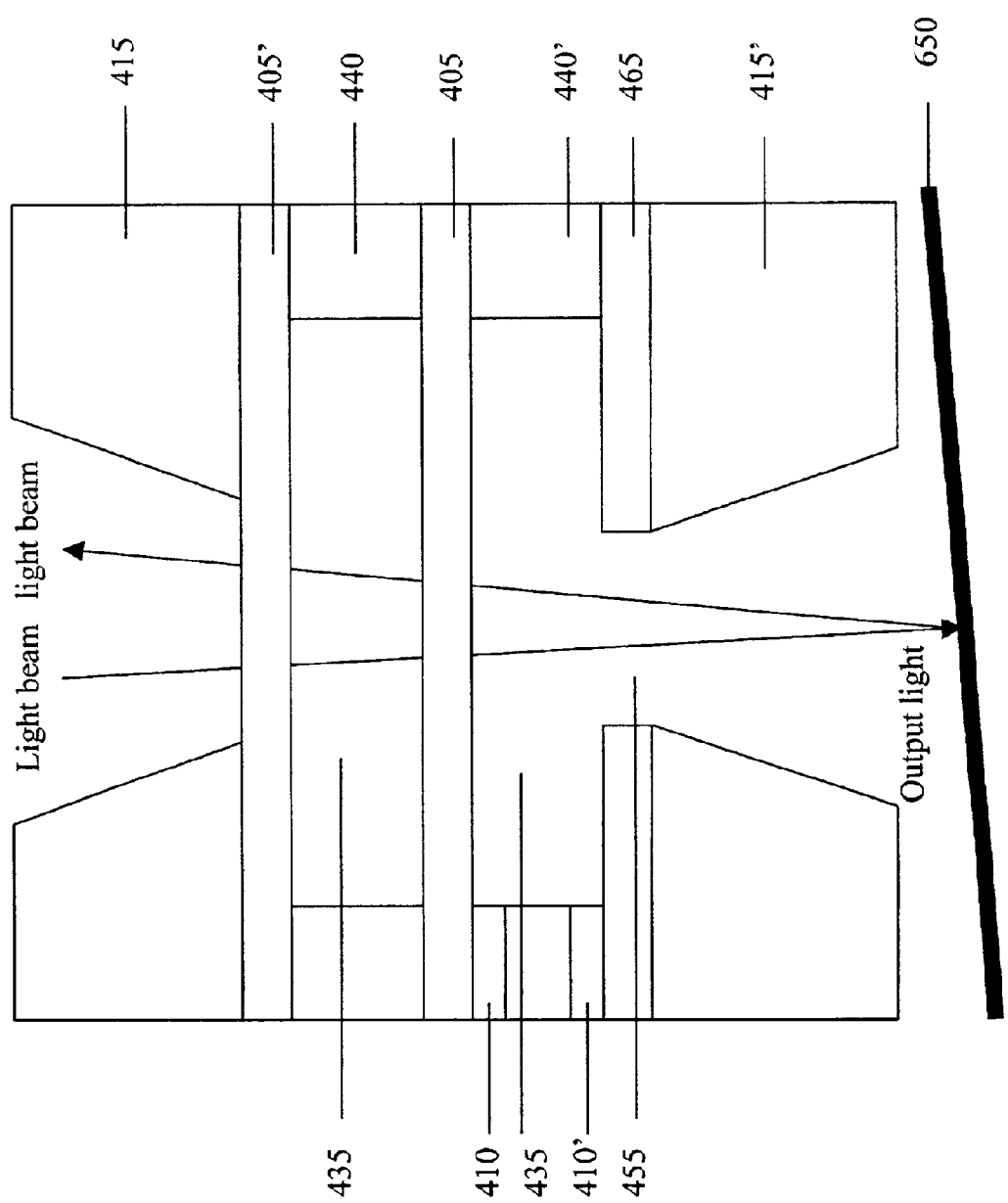
FIG. 6 is a cross sectional view of double cavities and a 100% reflection mirror to form a tunable device with the light beam pass twice the resonator.

FIG. 6 is a cross section of another preferred embodiment of this invention with a 100% reflective mirror 650 placed at the bottom of double cavity to form a double-path device. With the reflection mirror, the light passes twice through the MEMS resonator where the resonator is formed with the same structure disclosed, in FIG. 3. The mirror is placed with a small tilt angle with the MEMS filter, so that the unexpected resonator effect can be prevented. For a tunable filter, by using this configuration, compared to a single path filter, the fineness of filter is increased 1.414 times and the extension ratio can be doubled. Conventionally, it is difficult to fabricate membrane with very high reflection rate to increase the fineness of a filter due to material absorption and membrane deformation. This improved configuration provides a technique to overcome these difficulties for increasing the fineness. This configuration is also useful in a variable optical attenuator (VOA) to double the attenuation range and the technique is more efficient than a technique of increasing the reflection rate of membrane to achieve higher attenuation range. A co-pending patent application Ser. No. 09/877,376 filed by a common inventor of this Application discloses a MEMS VOA, and that invention is hereby incorporated herein as reference. This configuration can also be conveniently implemented in the MEMS VOA disclosed in the co-pending application Ser. No. 09/877,376 by adding a total reflection mirror to increase the attenuation range of VOA with similar configuration by bonding two membrane cells together.

Figure 7B:
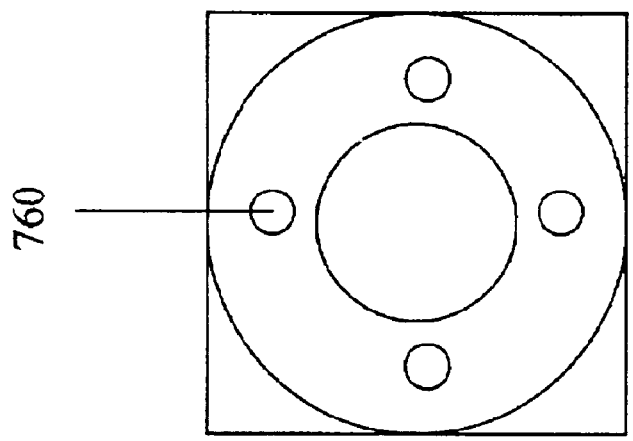
FIGS. 7A and 7B are top views of tuning membrane or stationary membrane with small through holes on it.
Figure 7A:
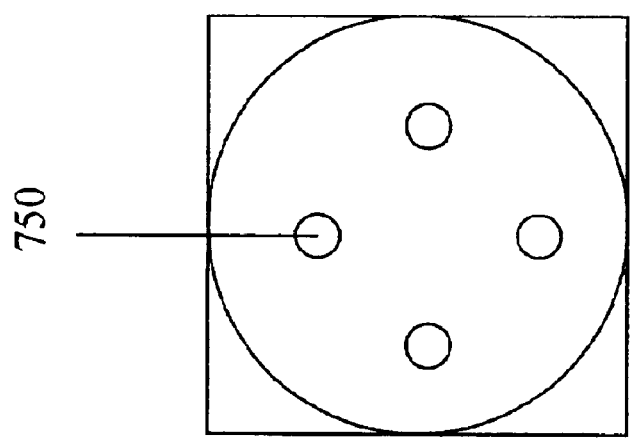

FIGS. 7A and 7B show the tuning membrane or stationary membrane with small through holes 750 and 760 on it. The small holes reduce the air damping effect and make the MEMS cavity fabrication easily.

Figure 8:
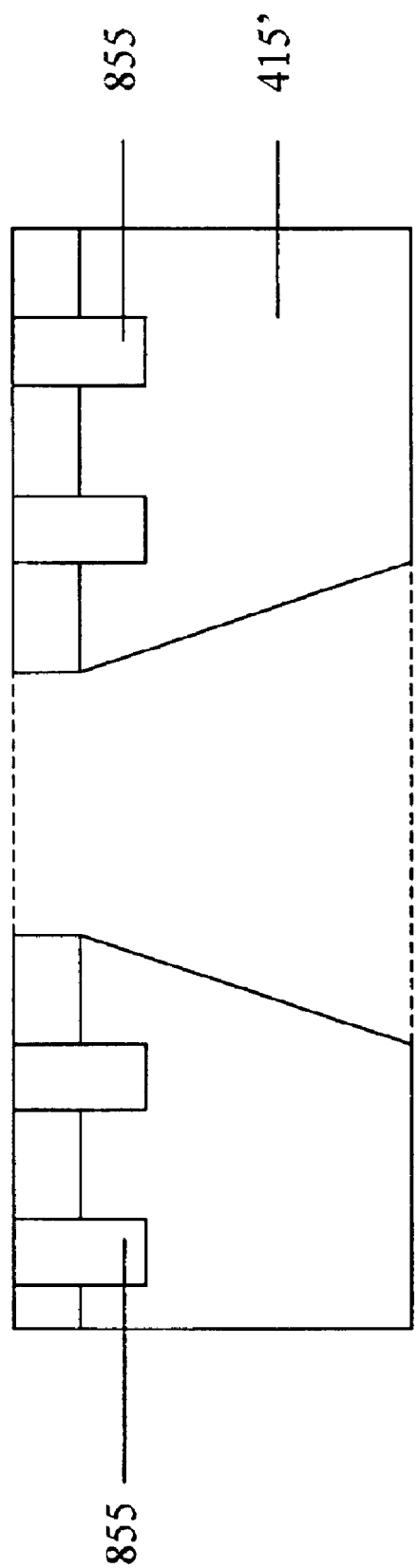
FIG. 8 is a cross sectional view of a hollow through holes formed on substrate of tuning cavity.

FIG. 8 is a cross sectional view of hollows 855 formed on substrate 415' to support the tuning cavity. These hollows on the substrate 415' reduce an air damping effect and simplify the cavity fabrication.

According to above descriptions, a tunable optical device is disclosed. The tunable optical device includes a tuning cavity having a tuning means provided for alternately bonding to at least two different tunable optical cells each comprising a tuning membrane wherein the tuning cavity disposed near the tuning membrane for moving the tuning membrane for tuning one of the at least two tunable optical cells bonded thereon. In a preferred embodiment, the tuning cavity further includes a first electrode disposed on the tuning membrane and a second electrode disposed on a substrate supporting the tuning cavity for applying a voltage to move the tuning membrane. In a preferred embodiment, the optical device further includes an optical device control circuit connected to the tuning means for controlling and moving the tuning membrane. In a preferred embodiment, the tuning cavity further includes through hole along an optical path for an optical transmission passing through the tunable membrane for providing an interface-free and ripple-free optical path for the optical transmission. In a preferred embodiment, the tunable optical cells constitute an optical filter for bonding to the tuning cavity and tunable by moving the tunable membrane. In a preferred embodiment, the tunable optical cells constitute an optical attenuator for bonding to the tuning cavity and tunable by moving the tunable membrane. In a preferred embodiment, the tunable optical cells constitute an optical switch for bonding to the tuning cavity and tunable by moving the tunable membrane. In a preferred embodiment, the tunable optical cells constitute an optical dispersion compensator for bonding to the tuning cavity and tunable by moving the tunable membrane. In a preferred embodiment, the optical device constitutes a micro-electro-mechanical system (MEMS) optical device manufactured by applying a micro-electro-mechanical system (MEMS) technology.

According to above descriptions, a tunable micro-electro-mechanical system (MEMS) device is disclosed by this invention. The MEMS device further includes a performance cavity having a stationary membrane and a tuning membrane wherein a functional performance of the MEMS optical device depending on a gap between the stationary membrane and the tuning membrane. The optical device further includes a tuning cavity disposed immediately next to the tuning membrane having a tuning means for moving the tuning membrane for adjusting the gap between the stationary membrane and the tuning membrane for tuning the functional performance of the MEMS optical device. In a preferred embodiment, the tuning cavity further includes a first electrode disposed on the tuning membrane and a second electrode disposed on a substrate supporting the tuning cavity for applying a voltage to move the tuning membrane. In a preferred embodiment, the optical device further includes an optical device control circuit connected to the tuning means for controlling the gap between the stationary membrane and the tuning membrane. In a preferred embodiment, the stationary membrane and the tuning membrane are contemporaneously manufactured by employing an identical set of processing steps on a same lot of semiconductor wafers.

This invention further discloses a method for configuring a tunable optical device. The method includes a step of forming a tuning cavity by providing a tuning means for alternately bonding one of at least two different tunable optical cells each comprising a tuning membrane and disposing the tuning cavity near the tuning membrane for moving the tuning membrane for tuning one of the at least two tunable optical cells bonded thereon. In a preferred embodiment, the step of forming the tuning cavity further includes a step of disposing a first electrode on the tuning membrane and disposing a second electrode on a substrate supporting the tuning cavity for applying a voltage to move the tuning membrane. In a preferred embodiment, the method further includes a step of connecting an optical device control circuit to the tuning means for controlling and moving the tuning membrane. In a preferred embodiment, the step of forming the tuning cavity further includes a step of opening a through hole in the tuning cavity along an optical path for an optical transmission passing through the tunable membrane for providing an interface-free and ripple-free optical path for the optical transmission. In a preferred embodiment, the step of alternately bonding the one of at least two different types of tunable optical cells further comprise a step of bonding an optical filter to the tuning cavity. In a preferred embodiment, the step of alternately bonding the one of at least two different types of tunable optical cells further comprise a step of bonding an optical attenuator to the tuning cavity. In a preferred embodiment, the step of alternately bonding the one of at least two different types of tunable optical cells further comprise a step of bonding an optical switch to the tuning cavity. In a preferred embodiment, the step of alternately bonding the one of at least two different types of tunable optical cells further comprise a step of bonding an optical dispersion compensator to the tuning cavity. In a preferred embodiment, the step of alternately bonding the one of at least two different types of tunable optical cells to the tunable cavity further comprising a step of applying a micro-electro-mechanical system (MEMS) technology for manufacturing and bonding the one of at least two different types of tunable optical cells to the tuning cavity.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A tunable micro-electro-mechanical system (MEMS) optical device comprising:
   a performance cavity having a stationary membrane and a tuning membrane wherein a functional performance of said MEMS optical device depending on a gap between said stationary membrane and said tuning membrane; and
   a tuning cavity disposed immediately next to said tuning membrane having a tuning means for moving said tuning membrane for adjusting said gap between said stationary membrane and said tuning membrane for tuning said functional performance of said MEMS optical device.

2. The MEMS optical device of claim 1 wherein:
   said tuning cavity further includes a first electrode disposed on said tuning membrane and a second electrode disposed on a substrate supporting said tuning cavity for applying a voltage to move said tuning membrane.

3. The MEMS optical device of claim 1 further comprising:
   an optical device control circuit connected to said tuning means for controlling said gap between said stationary membrane and said tuning membrane.

4. The MEMS optical device of claim 1 wherein:
   said stationary membrane and said tuning membrane are contemporaneously manufactured by employing an identical set of processing steps on a same semiconductor wafer.

5. The MEMS optical device of claim 1 wherein:
   said stationary membrane and said tuning membrane each further comprising multiple layers.

6. The MEMS optical device of claim 1 wherein:
   said stationary membrane and said tuning membrane having substantially identical reflection rate.

7. The MEMS optical device of claim 1 wherein:
   said performance cavity further includes a spacer disposed between said stationary membrane and said tuning membrane, said spacer having a thickness substantially equal to said gap between said stationary membrane and said tuning membrane.

8. The MEMS device of claim 1 wherein:
   the stationary membrane and said tuning membrane comprising a plurality of layers with a sequence of alternating high-low refraction indexes whereby said stationary membrane and said tuning membrane having reflection rates defined by the application of one certain optical device.

9. The MEMS device of claim 1 wherein:
   the stationary membrane and said tuning membrane comprising an odd number of layers with a sequence of alternating high-low refraction indexes with two outermost layers each having a high refraction index whereby said stationary membrane and said tuning membrane having reflection rates defined by the application of one certain optical device.

10. The MEMS device of claim 1 wherein:
    said stationary membrane and said tuning membrane having substantially different reflection rates.

11. A tunable optical device comprising:
    a tuning cavity having a tuning means provided for bonding to an optical cell comprising a tuning membrane wherein said tuning means disposed near said tuning membrane for moving said tuning membrane for tuning said tunable optical cell bonded thereon.

12. The optical device of claim 11 wherein:
    said tuning cavity further includes a first electrode disposed on said tuning membrane and a second electrode disposed on a substrate supporting said tuning cavity for applying a voltage to move said tuning membrane.

13. The optical device of claim 11 further comprising:
    an optical device control circuit connected to said tuning means for controlling and moving said tuning membrane.

14. The optical device of claim 11 wherein:
    said tuning cavity further includes through hole disposed along an optical path for an optical transmission passing through said tunable membrane for providing an interface-free and ripple-free optical path for said optical transmission.

15. The optical device of claim 11 wherein:
    said tunable optical cells constituting an optical filter for bonding to said tuning cavity and tunable by moving said tunable membrane.

16. The optical device of claim 11 wherein:
    said tunable optical cells constituting an optical attenuator for bonding to said tuning cavity and tunable by moving said tunable membrane.

17. The optical device of claim 11 wherein:
    said tunable optical cells constituting an optical switch for bonding to said tuning cavity and tunable by moving said tunable membrane.

18. The optical device of claim 11 wherein:
    said tunable optical cells constituting an optical dispersion compensator for bonding to said tuning cavity and tunable by moving said tunable membrane.

19. The optical device of claim 11 wherein:
    said optical device constituting a micro-electro-mechanical system (MEMS) optical device manufactured by applying a micro-electro-mechanical system (MEMS) technology.

20. The optical device of claim 11 wherein:
    said tunable optical cell further comprising a performance cavity having a stationary membrane disposed face-to-face with said tuning membrane wherein a functional performance of said optical device depending on a gap between said stationary membrane and said tuning membrane, and the reflection rates of two membranes.

21. The optical device of claim 20 wherein:
    said stationary membrane and said tuning membrane are contemporaneously manufactured by employing an identical set of processing steps on a same semiconductor wafer.

22. The optical device of claim 20 wherein:
    said stationary membrane and said tuning membrane each further comprising reflection rates defined by the application of one certain optical device.

23. The optical device of claim 20 wherein:
    said stationary membrane and said tuning membrane having substantially identical reflection rate.

24. The optical device of claim 20 wherein:
said performance cavity further includes a spacer disposed between said stationary membrane and said tuning membrane, said spacer having a thickness substantially equal to said gap between said stationary membrane and said tuning membrane.

25. The device of claim 20 wherein:
said stationary membrane and said tuning membrane comprising a plurality of layers with a sequence of alternating high-low refraction indexes whereby said stationary membrane and said tuning membrane having reflection rates defined by the application of one certain optical device.

26. The device of claim 20 wherein:
said stationary membrane and said tuning membrane comprising an odd number of layers with a sequence of alternating high-low refraction indexes with two outermost layers each having a high refraction index whereby said stationary membrane and said tuning membrane having reflection rates defined by the application of one certain optical device.

27. The device of claim 14 further comprising:
a total reflection mirror disposed below said through hole for reflecting said optical transmission back for transmitting twice through said tunable optical cell.

28. The MEMS device of claim 27 wherein:
said total reflection mirror is placed with a small tilt angle relative to a perpendicular plane of said optical path for reflecting said optical transmission without generating an unexpected resonating effect and ripple.

29. A micro-electro-mechanical system (MEMS) device comprising:
a first free-standing optical transmissive membrane supported on a first substrate having a first optically active portion constituting a stationary membrane;
a second free-standing optical transmissive membrane supported on a second substrate having a second optically active portion constituting a tuning membrane; and
a tuning cavity disposed immediately next to said tuning membrane having a tuning means for moving said tuning membrane for adjusting a gap between said stationary membrane and said tuning membrane for tuning said functional performance of said MEMS optical device.

30. The MEMS optical device of claim 29 wherein:
said first substrate bonded to said second substrate with said first and second optical transmissive membranes defining a resonating chamber constituting an interface-free optical path entering and exiting said resonating chamber; and
said tuning cavity further includes through hole along said interface-free optical path for providing an interface-free and ripple-free optical path for an optical transmission.

31. The MEMS optical device of claim 29 wherein:
said tuning cavity further includes a first electrode disposed on said tuning membrane and a second electrode disposed on a substrate supporting said tuning cavity for applying a voltage to move said tuning membrane.

32. The MEMS optical device of claim 29 further comprising:
an optical device control circuit connected to said tuning means for controlling said gap between said stationary membrane and said tuning membrane.

33. The MEMS device of claim 29 wherein:
the stationary membrane and said tuning membrane comprising a plurality of layers with a sequence of alternating high-low refraction indexes whereby said stationary membrane and said tuning membrane having reflection rates substantially greater than 50%.

* * * * *